(12) United States Patent
Chen

(10) Patent No.: US 11,985,786 B2
(45) Date of Patent: May 14, 2024

(54) INFORMATION HANDLING SYSTEM RACK ADAPTABLE DEPTH

(71) Applicant: Dell Products L.P., Round Rock, TX (US)

(72) Inventor: Yi-Hsuan Chen, Taoyuan (TW)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/856,255

(22) Filed: Jul. 1, 2022

(65) Prior Publication Data
US 2024/0008210 A1 Jan. 4, 2024

(51) Int. Cl.
*H05K 7/14* (2006.01)

(52) U.S. Cl.
CPC ......... *H05K 7/1489* (2013.01); *H05K 7/1498* (2013.01)

(58) Field of Classification Search
CPC ...... H05K 7/14; H05K 7/1401; H05K 7/1488; H05K 7/1489; H05K 7/1497; H05K 7/1498; H05K 7/18; H05K 7/183; H05K 7/186; H05K 7/1435; H05K 7/1485; H05K 7/1494; G06F 1/181; A47B 45/00; G01C 3/02
USPC ..................................................... 361/679.02
See application file for complete search history.

(56) References Cited

U.S. PATENT DOCUMENTS

| | | | |
|---|---|---|---|
| 5,842,283 A * | 12/1998 | Yatsu | G01B 7/003 33/708 |
| 6,223,908 B1 * | 5/2001 | Kurtsman | H04Q 1/08 211/175 |
| 7,425,682 B2 | 9/2008 | Rasmussen et al. | |
| 7,694,926 B2 | 4/2010 | Allen et al. | |
| 9,313,914 B2 | 4/2016 | Judge et al. | |
| 9,750,155 B2 | 8/2017 | Henderson | |
| 10,721,844 B1 | 7/2020 | Kowalski et al. | |
| 11,004,032 B2 | 5/2021 | Wolf et al. | |
| 2002/0117462 A1 * | 8/2002 | Hung | H05K 7/183 211/175 |
| 2002/0153335 A1 * | 10/2002 | Robideau | H05K 7/18 211/175 |
| 2003/0046339 A1 * | 3/2003 | Ip | H04L 41/12 709/203 |
| 2003/0062326 A1 * | 4/2003 | Guebre-Tsadik | H05K 7/186 211/175 |

(Continued)

FOREIGN PATENT DOCUMENTS

| | | | | |
|---|---|---|---|---|
| EP | 1471781 A1 * | 10/2004 | | H05K 7/18 |
| JP | 03153915 A * | 7/1991 | | |

(Continued)

*Primary Examiner* — Adrian S Wilson
*Assistant Examiner* — Gage Crum
(74) *Attorney, Agent, or Firm* — ZAGORIN CAVE LLP; Robert W. Holland

(57) ABSTRACT

A server information handling system rack has an adjustable depth to fit different sized server rack sleds and adapt the rack to different sized data centers. Fixed vertical supports couple to fixed horizontal supports to define a rack interior that adjusts in depth by sliding horizontal supports that change a position of extensible vertical supports coupled to the sliding horizontal supports. When a desired rack depth is set, the fixed horizontal supports and sliding horizontal supports are affixed to each other, such as with a screw that couples to a threaded nut of the fixed horizontal support.

17 Claims, 6 Drawing Sheets

(56) References Cited

U.S. PATENT DOCUMENTS

| | | | |
|---|---|---|---|
| 2006/0171538 A1* | 8/2006 | Larson | G06K 7/10366 380/258 |
| 2007/0144982 A1* | 6/2007 | Nguyen | H05K 7/186 211/26 |
| 2014/0190910 A1* | 7/2014 | Arflack | H05K 7/18 211/175 |
| 2016/0262283 A1 | 9/2016 | Phillips et al. | |
| 2017/0079164 A1 | 3/2017 | Crawford | |
| 2017/0118851 A1* | 4/2017 | Lin | G11B 33/00 |
| 2018/0213672 A1* | 7/2018 | Eckberg | H05K 7/18 |

FOREIGN PATENT DOCUMENTS

| | | | | |
|---|---|---|---|---|
| JP | 2016184686 A | * | 10/2016 | G06F 1/16 |
| WO | WO-2015097779 A1 | * | 7/2015 | G06F 1/00 |

* cited by examiner

INFORMATION HANDLING SYSTEM RACK ADAPTABLE DEPTH

BACKGROUND OF THE INVENTION

Field of the Invention

The present invention relates in general to the field of server information handling systems, and more particularly to an information handling system rack having an adaptable depth.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Server information handling systems support communications with client information handling systems through networks to provide a variety of enterprise and personal functions, such as enterprise shopping sites, data storage, etc. . . . A typical enterprise will often have multiple server information handling systems deployed in one or more data centers to support enterprise operations. In some instances, enterprises will deploy applications to virtual server information handling systems of a "cloud" infrastructure. In any case, the server information handling systems are typically deployed to data centers that have specialized power and cooling resources to ensure reliable operation of the server information handling systems. For example, server information handling systems are typically vertically stacked in server racks having uniform sizes, such as 1U, 2U, etc . . . , which is 1.75 inches of vertical height per U. One side of the server rack faces vents having conditioned air that is pulled into the server information handling systems by internal cooling fans and exhausted at an opposing side of the server rack. The cooling airflow maintains optimal operating conditions for the server information handling systems, which are organized to efficiently use expensive data center space. Further, the server racks also typically include power and communication cabling to efficiently set up and maintain the data center. Generally, to replace an installed server information handling system at a server rack, a rack sled holding the server information handling system is pulled out and replaced with another rack sled.

Although server information handling systems typically come in defined vertical "U" heights, the depth can sometimes vary. For instance, typical server information handling system rack depths can vary between 1000 mm, 1070 mm, 1075 mm and 1200 mm. Data centers may have defined rack depths to match available space or may simply have legacy server racks of particular depths available. Although the difference in rack depths is minor, an incorrect match with a server rack sled can be problematic. Maintaining an inventory of server racks of different sizes increases the cost and complexity of servicing different data centers. When an incorrect server rack or server rack sled is delivered to a data center, it can delay installation of the server information handling system and result in a poor customer experience. Shipping the correct equipment to data centers presents an inventory and logistics challenge with delays amplified by shipping delays for the relatively heavy equipment.

SUMMARY OF THE INVENTION

Therefore, a need has arisen for a system and method which adjusts a server information handling system rack depth.

In accordance with the present invention, a system and method are provided which substantially reduce the disadvantages and problems associated with previous methods and systems for adapting a server information handling system to a data center's depth constraints. Sliding horizontal supports engages with fixed horizontal supports slide relative to each other to establish a depth between fixed vertical supports coupled to the fixed horizontal supports and extensible vertical supports coupled to the sliding horizontal supports.

More specifically, a server information handling system rack has plural slots to accept server information handling system rack sleds having processing components that cooperate to process information, such as central processing unit and a random access memory. The server information handling system rack has a variable depth selected by moving extensible vertical supports relative to fixed vertical supports. More specifically, fixed horizontal supports affix to the fixed vertical supports to define a rack interior minimum size. The fixed horizontal supports engage with sliding horizontal supports that couple to the extensible vertical supports. Sliding the sliding horizontal support relative to the fixed horizontal support moves the extensible vertical support relative to the fixed vertical support so that the rack depth adjusts between extended and retracted positions, such as between a range of 1070 mm to 1200 mm. A position sensor associated with the rack detects the rack depth and reports the depth to a data center inventory manager to help coordinate replacement racks and sleds of compatible dimensions with the deployed rack depth configuration.

The present invention provides a number of important technical advantages. One example of an important technical advantage is that a server information handling system server rack adjusts depth to fit into different sized data centers and accept different sized server information handling system sleds. Sliding horizontal supports engaged with fixed vertical supports extend the rack depth in a variable manner to adjust the rack as needed for use in a data center. A robust server information handling system rack solution is provided by securing the sliding supports at desired positions and coupling variable sized side walls into place. For instance, one information handling system rack can convert between 1000 mm, 1070 mm, 1075 mm, and 1200 mm depths without any external pieces or materials to provide data center information technology professionals with a fast and flexible set up at a reduced cost and with minimal complexity.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

A server information handling system rack adjusts its depth with sliding supports to fit in variable sized information handling system rack sleds and to fit in variable sized data centers. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
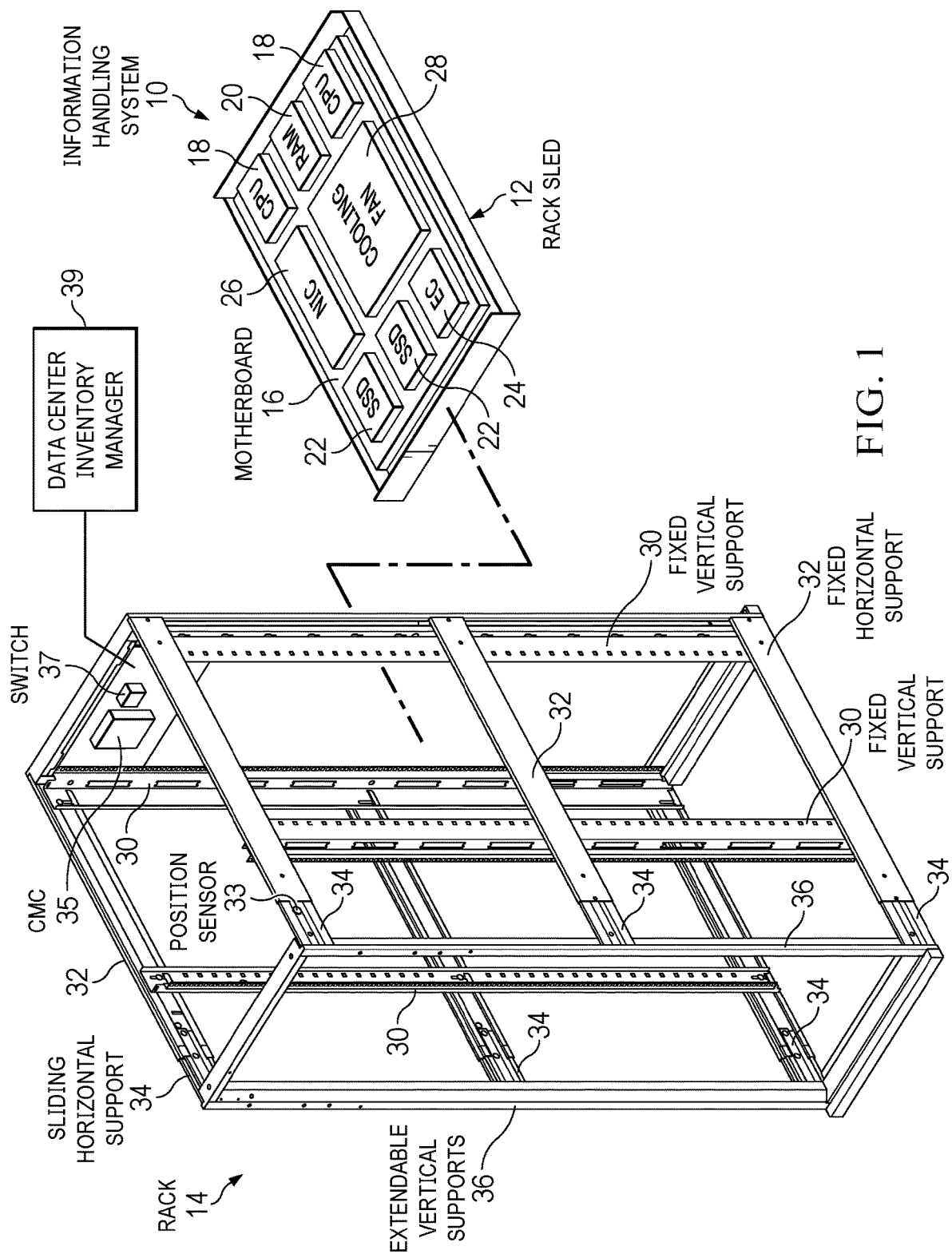
FIG. 1 depicts a side perspective view of an information handling system rack having variable configurable depths.

Referring now to FIG. 1, a side perspective view depicts a server information handling system 10 rack 14 having variable configurable depths. Server information handling system 10 is built in a rack sled 12 that couples to the interior of server information handling system rack 14, such as vertically stacked in a conventional manner with "U" standard heights. Server information handling system 10 built in rack sled 12 has a motherboard 16 that provides communication between the processing components that cooperate to process information. A central processing unit (CPU) 18 executes instructions to process information in cooperation with a random access memory (RAM) 20 that stores the instructions and information. A solid state drive (SSD) 22 provides persistent storage of instructions and information, such as during power down of the system. An embedded controller 24 manages physical operating conditions of the server information handling system 10, such as managing application of power and maintenance of thermal constraints. Embedded controller 24 includes flash memory that stores instructions to initiate power up of server information handling system 10, such as boot instructions to retrieve an operating system from SSD 22 to RAM 20 for execution on CPU 18. A network interface controller (NIC) 26 interfaces with CPU 18 to support communication with an external network, such as to provide server functionality to client information handling systems. Cooling fans 28 provide a cooling airflow across the processing components to reject thermal energy from within rack sled 12. Although the example embodiment depicts typical components of a server information handling system, alternative embodiments may have other configurations of components. In the example embodiment, plural rack sleds stack vertically in the rack, however, in alternative embodiments a horizontal arrangement of the rack sleds may be used.

In order to provide a variable depth of server information handling system rack 14, the frame structure of the rack is assembled from a fixed arrangement engaged with a sliding arrangement. In the example embodiment, four fixed vertical supports 30 define a minimal depth of rack 14 with a fixed relationship established by six fixed horizontal supports 32 coupled in a fixed manner, such as with screws. Six sliding horizontal supports 34 engage in a sliding relationship with the fixed horizontal supports 32 to adjust in length so that extensible vertical supports 36 change their position relative to fixed vertical supports 30 so that depth of the server rack is adjusted. In the example embodiment, the rack depth adjusts between 1070 mm and 1200 mm, although other depth dimensions may be supported. In the example embodiment, a position sensor 33 couples between a fixed horizontal support 32 and fixed horizontal support 34 to detect the sliding position of the supports and, thereby, the depth at which the rack is configured. For example, position sensor 33 is a switch that closes and opens based upon an overlap or lack of overlap of the fixed and sliding horizontal supports. The position sensor state is forwarded to a chassis management controller 35 of server information handling system rack 14 and a switch 37 to report the rack depth configuration to a data center inventory manager 39. By tracking server rack depth configuration, replacement server racks and information handling systems may be more simply matched to the existing configuration without requiring manual measurements.

Figure 2:
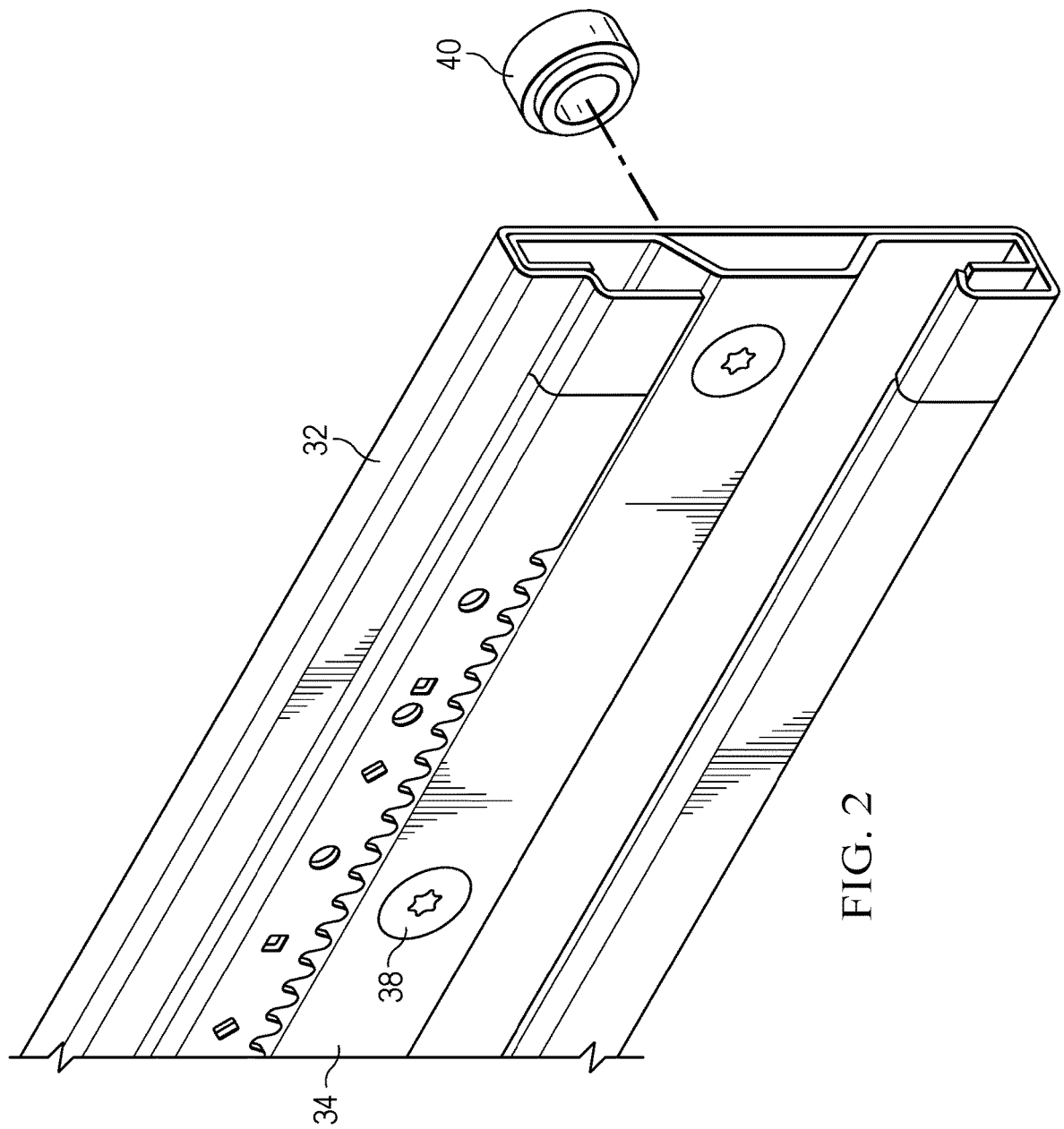
FIG. 2 depicts a side perspective detailed view of a fixed horizontal support engaged with a sliding horizontal support.

Referring now to FIG. 2, a side perspective detailed view depicts a fixed horizontal support 32 engaged with a sliding horizontal support 34. In the example embodiment, fixed horizontal support 32 is formed as a rail from bent sheet metal that has upper and lower lips to define a guide in which sliding horizontal support 34 fits. When set at the smallest rack depth, sliding horizontal support 34 retracts fully or almost fully into fixed horizontal guide 32. Threaded nuts 40 mount to fixed horizontal support 32 so that, when openings formed in sliding horizontal support 34 align with a threaded nut 40, a screw 38 may insert to hold through openings of sliding horizontal support 34 to affix sliding horizontal support 34 in position relative to fixed horizontal support 32. Once the horizontal supports are fixed in place relative to each other, the depth of the rack is set. For instance, holes are formed in sliding horizontal support 34 that set predefined rack depths, such as within a range of 1070 mm to 1200 mm.

Figure 3:
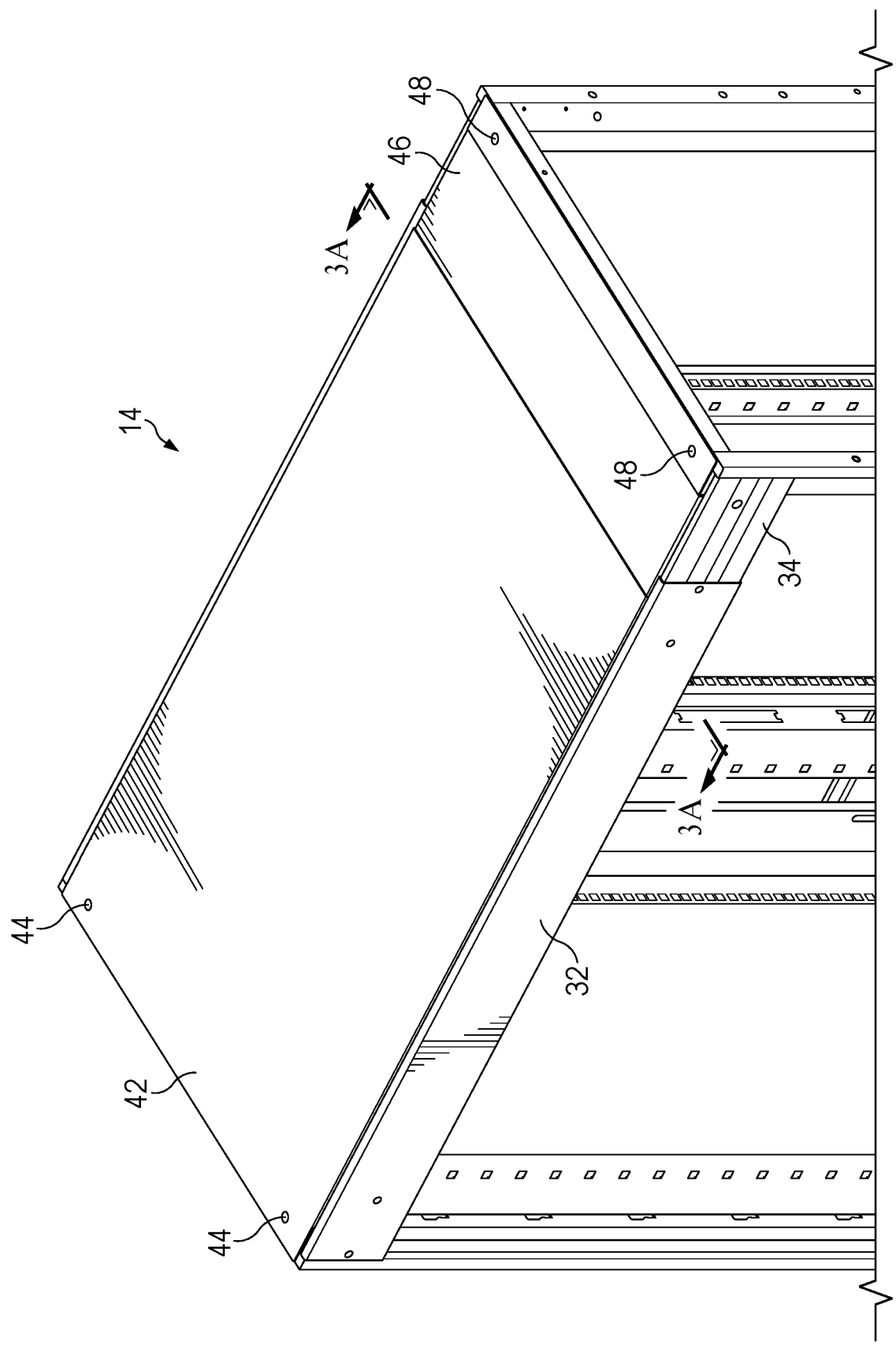
FIGS. 3 and 3A depict an upper perspective view of a lid having fixed and sliding portions to adjust to different rack depths.
Figure 3A:
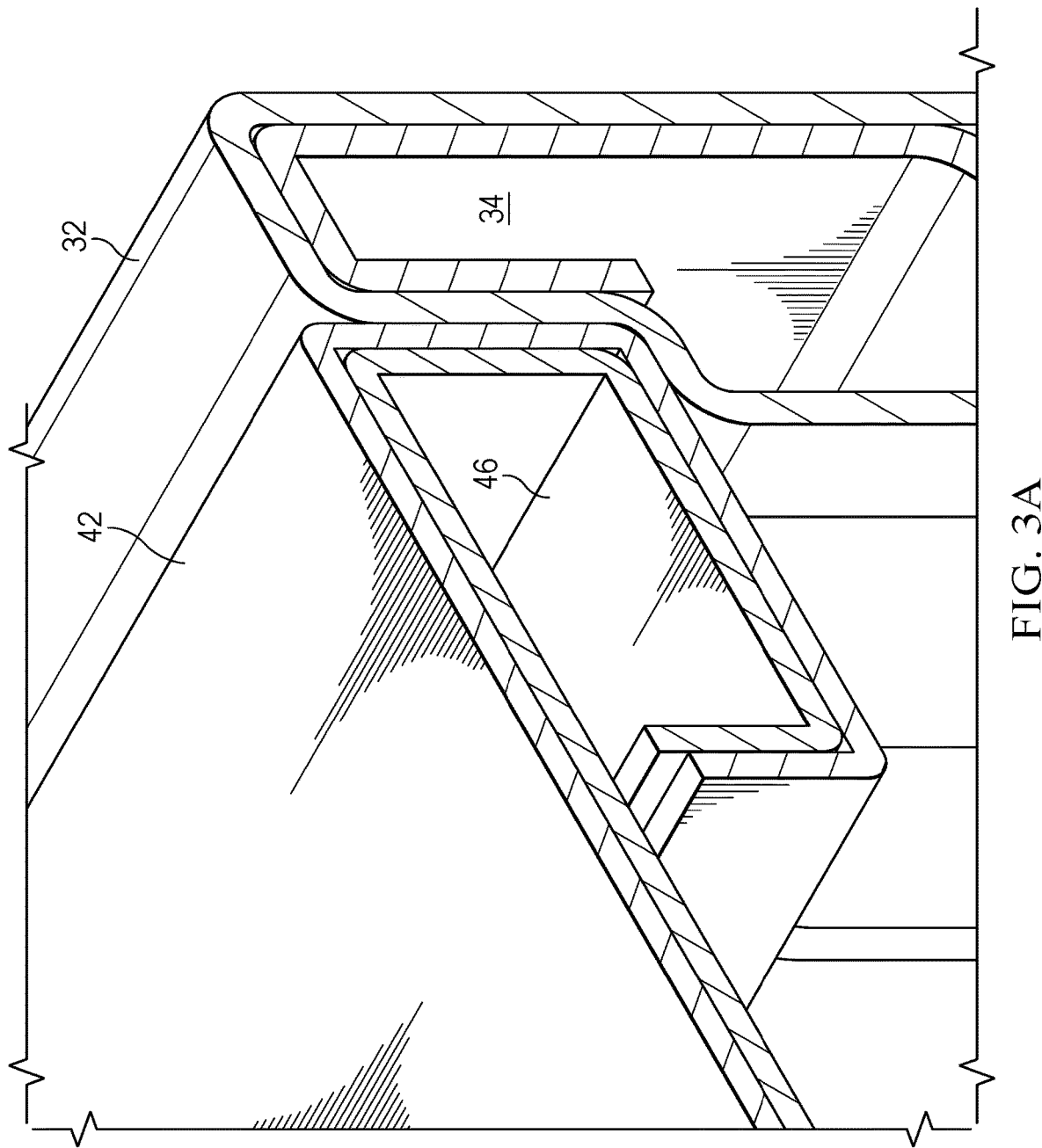

Referring now to FIGS. 3 and 3A an upper perspective view depicts a lid having fixed and sliding portions to adjust to different rack depths. In the example embodiment a fixed lid portion 42 couples with screws 44 to the upper part of the fixed horizontal and/or vertical supports of server information handling system rack 14. A sliding lid portion 46 engages with fixed lid portion 42 to extend and retract as sliding horizontal support 34 slides into and out of fixed horizontal support 32. Screws 48 couple sliding lid portion 46 to the sliding horizontal support and or extensible vertical support so extending or retracting sliding horizontal support 34 will adjust the lid by moving sliding lid portion 46 relative to fixed lid portion 42. FIG. 3A depicts a cross sectional view of one example embodiment of engagement of fixed lid portion 42 and sliding lid portion 46 in a sliding arrangement. In the example embodiment, fixed lid portion 42 and sliding lid portion 44 are bent to form interlocking rails and guides and slide relative to each other. Fixed lid portion 42 couples to fixed horizontal support 32 at one side of the server rack and sliding lid portion 46 couples to sliding horizontal support 34 at the opposing side so that sliding movement of sliding horizontal support 34 relative to fixed horizontal support 32 also adjusts the sliding and fixed lid portions.

Figure 4A:
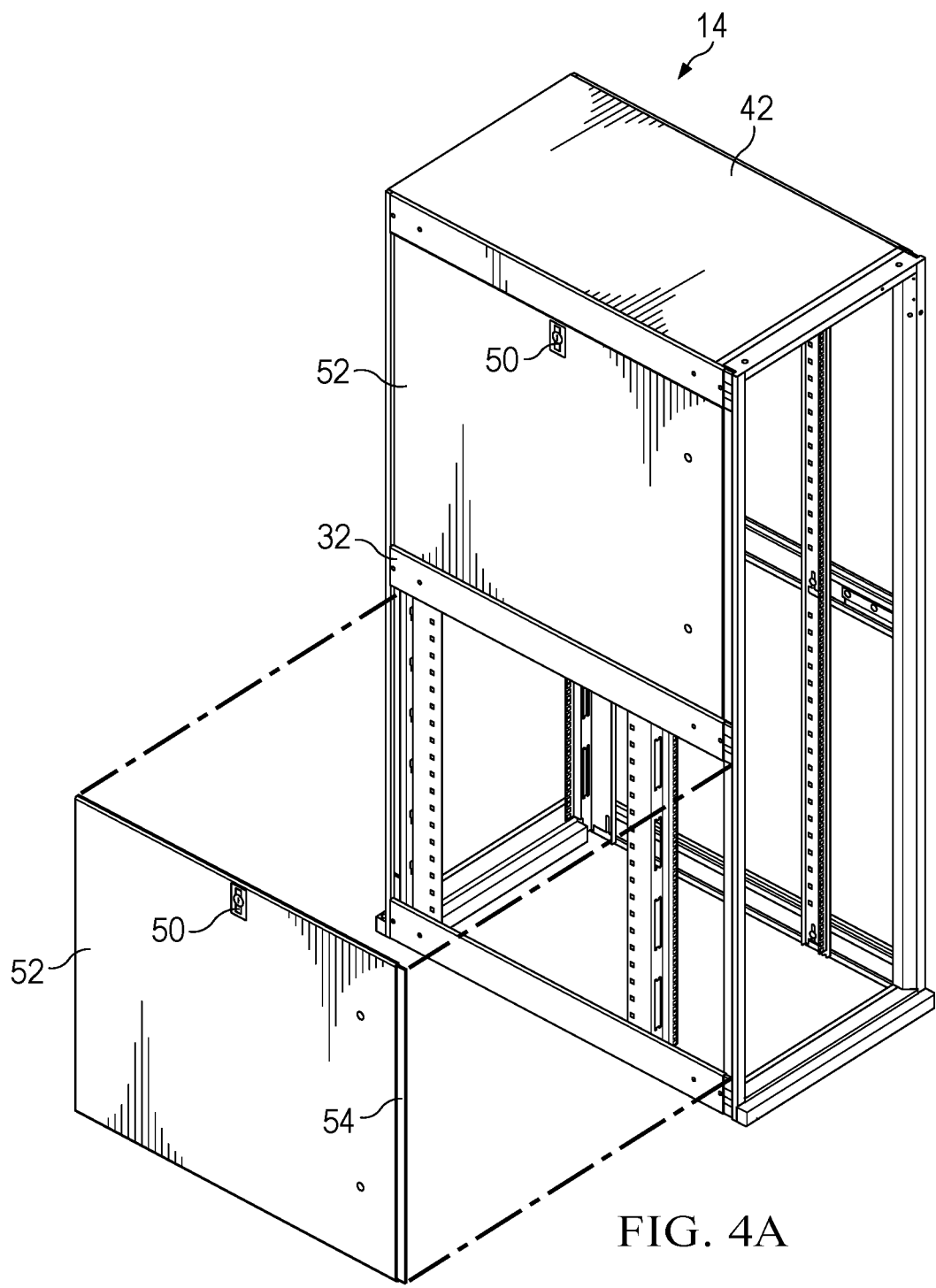
FIGS. 4A and 4B depict side perspective views of the information handling system server rack having variable depth with adjustable lid and side covers.
Figure 4B:
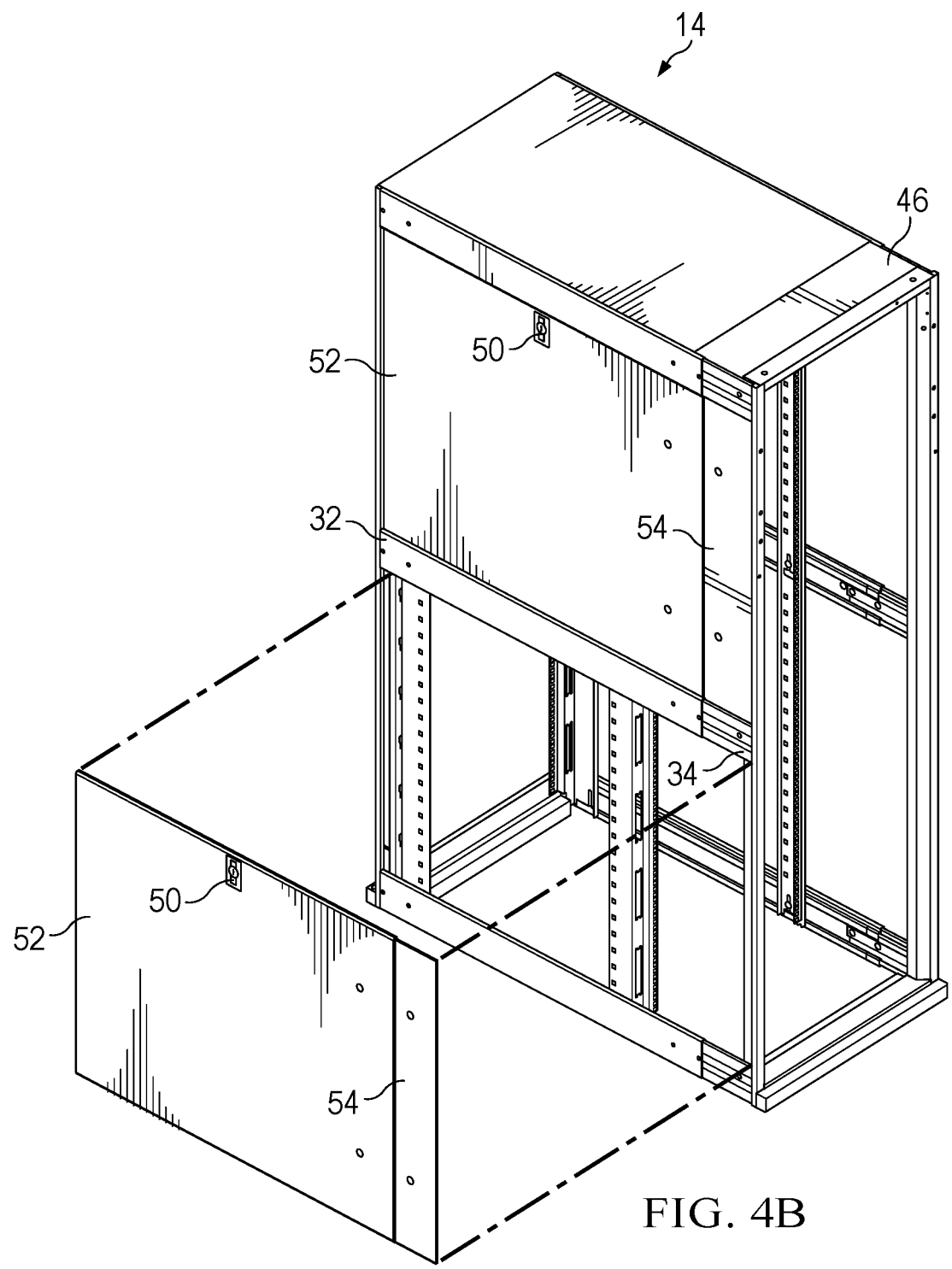

Referring now to FIGS. 4A and 4B, side perspective views depict the information handling system server rack 14 having variable depth with adjustable lid and side covers. FIG. 4A depicts the server rack having a minimal depth configuration with fixed lid portion 42 coupled at an upper surface and having sliding lid portion 46 retracted. A fixed side portion 52 couples to a side surface of the server rack and is held in position by a latch 50. A sliding side portion 54 engages with the fixed side portion 52 in a retracted position, such as to support a server rack depth of 1070 mm. FIG. 4B depicts information handling system server rack 14 adjusted to have an increased depth, such as 1200 mm. Sliding support member 34 slides out from fixed support member 32 and couples with sliding side portion 54 and sliding lid portion 46 to extend the side and lid outwardly at a 1200 m depth. Once the desired depth is achieved, screws fix the lid and side portions in place to maintain the rack depth configuration.

Although the present invention has been described in detail, it should be understood that various changes, substitutions and alterations can be made hereto without departing from the spirit and scope of the invention as defined by the appended claims.

What is claimed is:

1. A server information handling system comprising:
    a server sled configured to couple to a server rack;
    a processor disposed in the server sled and operable to execute instructions to process information;
    a memory disposed in the server sled and interfaced with the processor, the memory operable to store the instructions and information;
    a server rack configured to couple to plural server sleds, the server rack having plural fixed vertical supports coupled to plural fixed horizontal supports, the server rack further having plural sliding horizontal supports, each sliding horizontal support engaged with one of the plural fixed horizontal supports, the server rack further having plural extendible vertical supports coupled to the plural sliding horizontal supports, the plural fixed vertical supports and plural extendible vertical supports defining a rack interior depth, the plural sliding horizontal supports operable to slide relative to the plural fixed horizontal supports to move the plural extendible vertical supports relative to the plural fixed vertical supports thereby adjusting the rack interior depth;
    a sensor operable to detect a position of one or more of the plural fixed horizontal supports relative to one or more of the plural sliding horizontal supports to determine the rack interior depth resulting from adjusting; and
    a controller coupled to the server rack and interfaced with the sensor to communicate the rack interior depth to external the server rack.

2. The server information handling system of claim 1 further comprising:
    at least one threaded nut coupled to each of the fixed horizontal supports; and
    a screw configured to engage each threaded nut through an opening of the sliding horizontal supports to fix the rack interior depth.

3. The server information handling system of claim 2 wherein the opening of the sliding horizontal supports align with the at least one threaded nut to define rack interior depths of between 1200 mm and 1070 mm.

4. The server information handling system of claim 1 further comprising a side panel having a fixed portion coupled to at least some of the plural fixed horizontal supports and a sliding portion coupled to at least some of the plural sliding horizontal supports to adapt to the interior depth.

5. The server information handling system of claim 1 further comprising a top panel having a fixed portion coupled to at least some of the plural fixed horizontal supports and a sliding portion coupled to at least some of the plural sliding horizontal supports to adapt to the interior depth.

6. The server information handling system of claim 5 wherein the top panel comprises first and second sheet metal portions bent to define a sliding engagement.

7. The server information handling system of claim 1 wherein each of the plural fixed horizontal supports have upper and lower lips that define a sliding motion of one of the plural sliding horizontal supports.

8. The server information handling system of claim 1 further comprising an inventory manager interfaced with the controller to track the configuration of plural server racks having variable server rack interior depths.

9. A method for setting a server information handling system rack depth, the method comprising:
    affixing plural fixed vertical supports and plural fixed horizontal supports;
    affixing plural extensible vertical supports and plural sliding horizontal supports;
    slidingly engaging the plural sliding horizontal supports and the fixed horizontal supports;
    sliding the plural sliding horizontal supports relative to the plural fixed horizontal supports to a predetermined depth of the server rack interior between the plural fixed vertical supports and plural extensible vertical supports;
    sensing the predetermined depth with a sensor associated with one or more of the plural sliding horizontal supports and plural fixed horizontal supports; and
    communicating the predetermined depth from the server information handling system rack to a network location associated with a data center.

10. The method of claim 9 further comprising:
    coupling a side panel fixed portion to at least some of the plural fixed horizontal supports;
    coupling a side panel sliding portion to at least some of the plural sliding horizontal supports; and
    sliding the side panel fixed portion relative to the side panel sliding portion in response to the sliding the plural sliding horizontal supports relative to the plural fixed horizontal supports.

11. The method of claim 9 further comprising:
coupling a top panel fixed portion to at least some of the plural fixed horizontal supports;
coupling a top panel sliding portion to at least some of the plural sliding horizontal supports; and
sliding the top panel fixed portion relative to the top panel sliding portion in response to the sliding the plural sliding horizontal supports relative to the plural fixed horizontal supports.

12. The method of claim 9 wherein the predetermined depth has a range of between 1070 mm and 1200 mm.

13. The method of claim 9 further comprising:
tracking the predetermined depth of plural server information handling system racks at the network location; and
applying the predetermined depth of the plural server information handling system racks to manage server information handling system racks and server information handling system rack sleds sent to the data center.

14. The method of claim 9 further comprising:
coupling a threaded nut to each of the plural fixed horizontal supports; and
affixing the plural sliding horizontal supports to the threaded nuts with screws fit through openings of the plural sliding horizontal supports.

15. A server information handling system rack comprising:
plural fixed vertical supports;
plural fixed horizontal supports coupled to the plural fixed vertical supports;
plural sliding horizontal supports, each sliding horizontal support engaged with one of the plural fixed horizontal supports;
plural extendible vertical supports coupled to the plural sliding horizontal supports, the plural fixed vertical supports and plural extendible vertical supports defining a rack interior depth, the plural sliding horizontal supports operable to slide relative to the plural fixed horizontal supports to move the plural extendible vertical supports relative to the plural fixed vertical supports thereby adjusting the rack interior depth;
a sensor operable to detect a position of one or more of the plural fixed horizontal supports relative to one or more of the plural sliding horizontal supports to determine the adjusted rack interior depth; and
a controller coupled to the server rack and interfaced with the sensor to communicate the rack interior depth to external the server rack.

16. The server information handling system rack of claim 15 wherein the rack interior depth adjusts between 1070 mm and 1200 mm.

17. The server information handling system rack of claim 15 further comprising:
a side panel having a fixed portion coupled to at least some of the plural fixed horizontal supports and a sliding portion coupled to at least some of the plural sliding horizontal supports to adapt to the interior depth; and
a top panel having a fixed portion coupled to at least some of the plural fixed horizontal supports and a sliding portion coupled to at least some of the plural sliding horizontal supports to adapt to the interior depth.

* * * * *